United States Patent
Park et al.

(10) Patent No.: US 8,598,034 B2
(45) Date of Patent: Dec. 3, 2013

(54) PACKAGE-ON-PACKAGE SYSTEM WITH THROUGH VIAS AND METHOD OF MANUFACTURE THEREOF

(71) Applicants: DongSam Park, Seongnam-si (KR); JoungIn Yang, Koyang-si (KR)

(72) Inventors: DongSam Park, Seongnam-si (KR); JoungIn Yang, Koyang-si (KR)

(73) Assignee: STATS ChipPac Ltd., Singapore (SG)

( * ) Notice: Subject to any disclaimer, the term of this patent is extended or adjusted under 35 U.S.C. 154(b) by 0 days.

(21) Appl. No.: 13/679,615

(22) Filed: Nov. 16, 2012

(65) Prior Publication Data

US 2013/0075933 A1  Mar. 28, 2013

Related U.S. Application Data

(63) Continuation of application No. 13/169,387, filed on Jun. 27, 2011, now Pat. No. 8,334,601, which is a continuation of application No. 12/388,516, filed on Feb. 18, 2009, now Pat. No. 7,986,048.

(51) Int. Cl.
*H01L 21/44* (2006.01)
*H01L 21/48* (2006.01)

(52) U.S. Cl.
USPC ........... 438/667; 438/112; 438/124; 438/127; 438/672; 257/E23.038

(58) Field of Classification Search
USPC .................... 438/667, 672, 112, 124, 127; 257/E23.038
See application file for complete search history.

(56) References Cited

U.S. PATENT DOCUMENTS

| | | |
|---|---|---|
| 5,111,278 A | 5/1992 | Eichelberger |
| 5,562,971 A | 10/1996 | Tsuru et al. |
| 6,001,671 A | 12/1999 | Fjelstad |
| 6,333,211 B1 | 12/2001 | Sato et al. |
| 6,498,393 B2 | 12/2002 | Fujimoto et al. |
| 6,664,615 B1 | 12/2003 | Bayan et al. |
| 6,984,880 B2 | 1/2006 | Minamio et al. |
| 7,208,826 B2 | 4/2007 | Sakamoto et al. |
| 7,227,243 B2 | 6/2007 | Shizuno |
| 7,242,081 B1 | 7/2007 | Lee |
| 7,436,074 B2 | 10/2008 | Pan et al. |
| 7,608,482 B1 * | 10/2009 | Bayan ........................... 438/112 |
| 7,662,672 B2 | 2/2010 | Lin |
| 7,772,681 B2 | 8/2010 | Joshi et al. |
| 7,863,755 B2 | 1/2011 | Lee et al. |
| 7,911,047 B2 | 3/2011 | Hasegawa et al. |
| 8,034,704 B2 * | 10/2011 | Komai et al. ................. 438/613 |
| 8,183,088 B2 * | 5/2012 | Jeon et al. ..................... 438/106 |
| 2001/0045625 A1 * | 11/2001 | Sakamoto et al. ............ 257/666 |
| 2004/0173894 A1 * | 9/2004 | Glenn et al. .................. 257/693 |
| 2008/0036050 A1 | 2/2008 | Lin et al. |
| 2009/0045512 A1 * | 2/2009 | Hedler et al. ................. 257/738 |
| 2009/0050994 A1 * | 2/2009 | Ishihara et al. ............... 257/432 |
| 2009/0194888 A1 | 8/2009 | Jobetto |
| 2009/0236726 A1 | 9/2009 | Retuta et al. |
| 2009/0263938 A1 * | 10/2009 | Ino ............................... 438/124 |
| 2011/0063805 A1 | 3/2011 | Kim |
| 2011/0084401 A1 | 4/2011 | Lee et al. |

* cited by examiner

*Primary Examiner* — Nitin Parekh

(74) *Attorney, Agent, or Firm* — Ishimaru & Associates LLP; I-Chang John Yang

(57) ABSTRACT

A method of manufacture of a package-on-package system includes: providing a substrate connection; attaching a semiconductor die to the substrate connection using an adhesive, with the substrate connection affixed directly by the adhesive; forming an encapsulant around the semiconductor die to have a bottom exposed surface coplanar with a bottom surface of the substrate connection and to have a top exposed surface with through openings extending therefrom through the bottom exposed surface; and creating through vias by applying solder into the through openings, the through vias coplanar with the bottom exposed surface of the encapsulant and coplanar with the top exposed surface of the encapsulant.

9 Claims, 7 Drawing Sheets

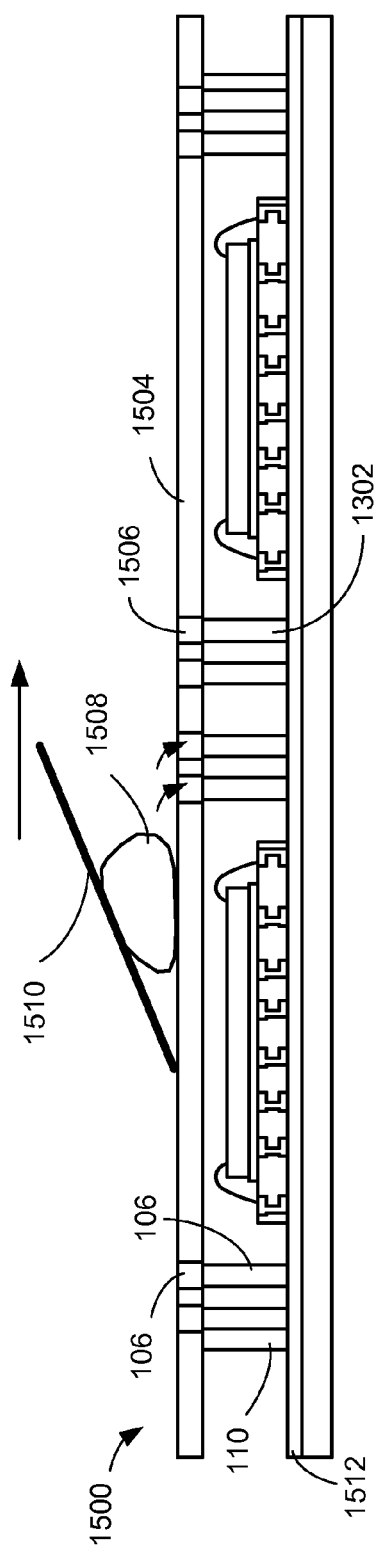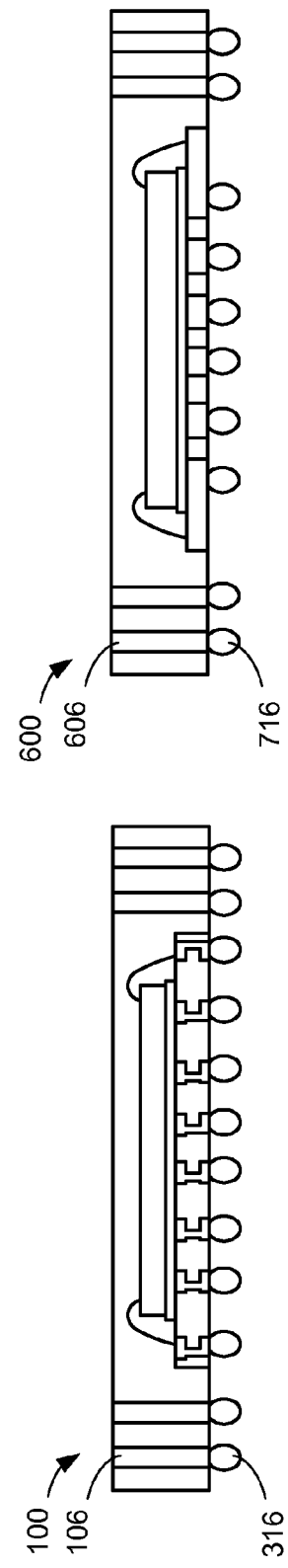

PACKAGE-ON-PACKAGE SYSTEM WITH THROUGH VIAS AND METHOD OF MANUFACTURE THEREOF

CROSS-REFERENCE TO RELATED APPLICATION(S)

This is a continuation of co-pending U.S. patent application Ser. No. 13/169,387 filed Jun. 27, 2011, which is a continuation of U.S. patent application Ser. No. 12/388,516, filed Feb. 18, 2009, now U.S. Pat. No. 7,986,048 B2.

TECHNICAL FIELD

The present invention relates generally to semiconductor package system, and more particularly to a stackable package-on-package system for multi-chip modules.

BACKGROUND ART

As new generations of electrical consumer products are developed there is a growing need to improve the functionality, performance, reliability, and manufacturing robustness of semiconductor packages. Additionally, new handheld consumer electronic devices such as cell phones and new laptop computers are increasingly designed to present a low-profile. This design trend imposes severe limitations on the thickness of individual electronic components.

System requirements for consumer electronics have motivated the implementation of integrated circuit packages incorporating several semiconductor dies or "chips". Such multi-chip packages may be realized by connecting multiple semiconductor dies on a single package substrate.

Alternatively, the Package-in-Package (PiP) approach for packaging multi-chip modules involves first mounting a semiconductor die on a package substrate with interconnects, forming an Internal Stacking Module (ISM). This package module can be tested individually prior to assembly into a multi-chip package. Thus the PiP approach provides a means of pre-testing package sub-assemblies (i.e., internal stacking modules), enabling the assembly of complex multi-chip packages using "known good packages." This modular approach for assembling multi-chip packages reduces overall yield loss.

Yet another implementation of a multi-chip package is termed "Package-on-Package" (PoP). In this approach, one monolithic package is stacked on top of another package using standard interconnects for routing signals between the two packages.

One drawback of existing PiP or PoP packages is that they do not provide sufficient versatility and reliability for integration into larger multi-chip packages. Thus, a need still remains for internal stacking module and/or package-on-package systems with increased interconnection capabilities and reduced overall thickness while improving its reliability.

More specifically, there is a need to reduce the cost of PiP and PoP systems and to reduce warping of the modules during fabrication to facilitate integration into larger multi-chip package modules. In view of yield loss due to package warping it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a package-on-package system including: providing a substrate connection; attaching a semiconductor die to the substrate connection using an adhesive, with the substrate connection affixed directly by the adhesive; forming an encapsulant around the semiconductor die to have a bottom exposed surface coplanar with a bottom surface of the substrate connection and to have a top exposed surface with through openings extending therefrom through the bottom exposed surface; and creating through vias by applying solder into the through openings, the through vias coplanar with the bottom exposed surface of the encapsulant and coplanar with the top exposed surface of the encapsulant.

Furthermore, the present invention provides a package-on-package system including: a substrate connection; an adhesive over the substrate connection; a semiconductor die attached to the substrate connection with the adhesive; an encapsulant surrounding at least portions of the package substrate and the semiconductor die, the encapsulant having a bottom exposed surface coplanar with a bottom surface of the substrate connection and a top exposed surface; and through vias extending from the top exposed surface to a bottom exposed surface of the encapsulant, the through vias coplanar with the bottom exposed surface of the encapsulant and coplanar with the top exposed surface of the encapsulant.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 15 is a mechanical device used to form the through vias in one embodiment of the invention.

FIG. 16 is the package-on-package system of FIG. 3 at the end of the fabrication process following the formation of the through vias and the external interconnects.

FIG. 17 is the package-on-package system of FIG. 6 at the end of the fabrication process following the formation of the through vias and the external interconnects.

BEST MODE FOR CARRYING OUT THE INVENTION

Figure 1:
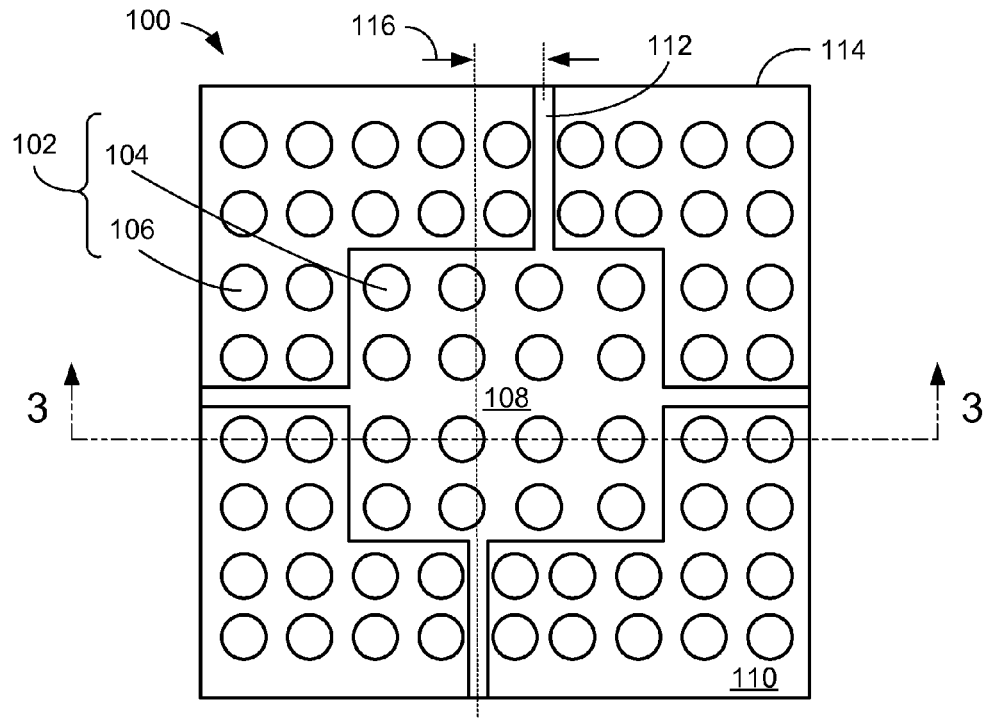
FIG. 1 is a bottom view of a package-on-package system in one embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of a package-on-package system 100 in one embodiment of the present invention. The package-on-package system 100 includes two types of external connections 102: substrate connections 104 and through vias 106.

The substrate connections 104 provide an electrical path through a package substrate 108. The through vias 106 are located entirely within an encapsulant 110, providing electrical connections through the package-on-package system 100.

The package substrate 108 includes tie bars 112 extending to edges 114 of the package-on-package system 100. In one embodiment of the invention, some of the tie bars 112 are configured with an offset 116 from each other.

Figure 2:
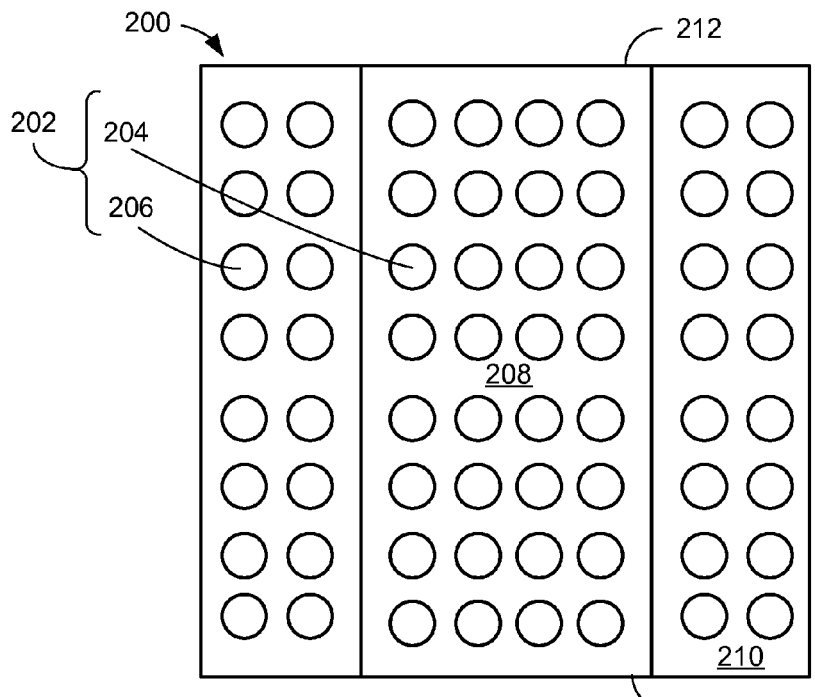
FIG. 2 is a bottom view of the package-on-package system in an alternate embodiment of the present invention.

Referring now to FIG. 2, therein is shown a bottom view of the package-on-package system 200 in an alternate embodiment of the present invention. Similar to the package-on-package system 100, the package-on-package system 200 includes two types of external connections 202: substrate connections 204 and through vias 206.

The substrate connections 204 provide an electrical path through a package substrate 208. The package substrate 208 has a rectangular shape that extends from an end edge 212 to an opposite edge 214 of the package-on-package system 200. An encapsulant 210 surrounds portions of the package substrate 208.

Figure 3:
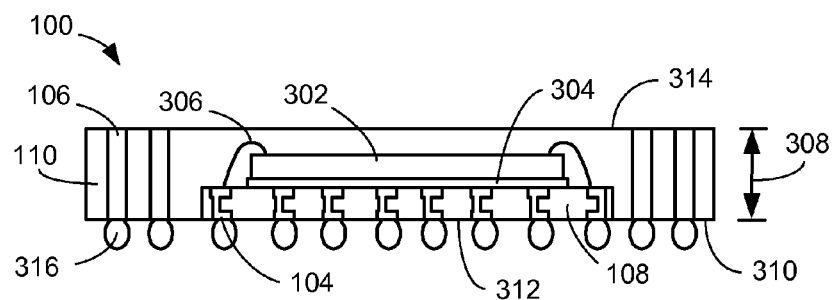
FIG. 3 is a cross-sectional view of the package-on-package system taken along line 3-3 shown in FIG. 1.

Referring now to FIG. 3, therein is shown a cross-sectional view of the package-on-package system 100 taken along line 3-3 shown in FIG. 1. A semiconductor die 302 is attached to the package substrate 108 using an adhesive 304. Electrical interconnects 306 provide connectivity between the semiconductor die 302 and the substrate connections 104. The electrical interconnects 306 may be implemented using bond wires as shown in FIG. 3.

The through vias 106 extend vertically through a thickness 308 of the package-on-package system 100 providing electrical connections through the package-on-package system 100. The encapsulant 110 has a bottom exposed surface 310 coplanar with a bottom surface 312 of the package substrate 108 and has a top exposed surface 314. The through vias 106 extend from the top exposed surface 314 to the bottom exposed surface 310 of the encapsulant 110. The through vias 106 can also be coplanar to the bottom exposed surface 310 and also coplanar with the top exposed surface 314.

The through vias 106 may be employed to provide interconnectivity between external components mounted above and below the package-on-package system 100. External interconnects 316 provide connectivity to the next system level.

It has been discovered that the package-on-package system 100 can be implemented using the package substrate 108 which is minimally larger than the semiconductor die 302, reducing the overall cost of the package-on-package system 100.

Additionally the package-on-package system 100 is less susceptible to warping as a result of the fabrication process. Therefore it may easily be integrated as part of a larger multi-chip module. The package-on-package system 100 may be electrically tested and classified as good known package (GKP) prior to integration into a larger module, increasing the overall reliability of a multi-chip module.

Thus, it has been discovered that the package-on-package system 100 of the present invention furnishes important and heretofore unknown and unavailable solutions, capabilities, and functional aspects for implementing a low-cost modular package that can be stacked into a multi-level package.

Figure 4:
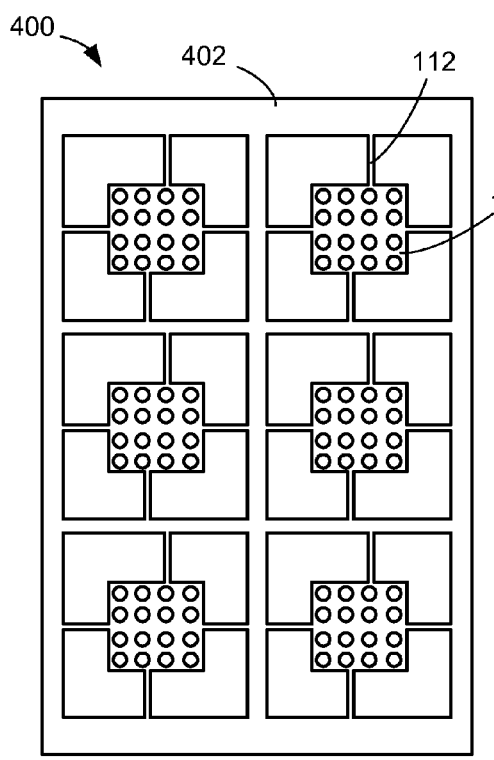
FIG. 4 is a top view of a package substrate assembly incorporating the package substrate of FIG. 3.

Referring now to FIG. 4, therein is shown a top view of a package substrate assembly 400 incorporating the package substrate 108 of FIG. 3. The package substrate assembly 400 incorporates multiple repetitions of the package substrate 108 held together by a frame 402 using the tie bars 112. The package substrate assembly 400 is used in the fabrication of the package-on-package system 100.

Figure 5:
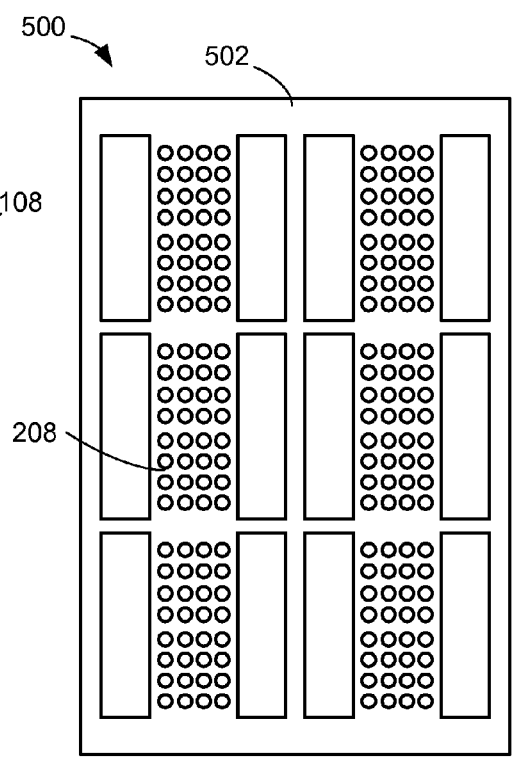
FIG. 5 is a top view of a package substrate assembly incorporating a package substrate in an alternate embodiment of the present invention.

Referring now to FIG. 5, therein is shown a top view of a package substrate assembly 500 incorporating the package substrate 208 in an alternate embodiment of the present invention. The package substrate assembly 500 incorporates multiple repetitions of the package substrate 208 held together by a frame 502. The package substrate assembly 500 is used in the fabrication of the package-on-package system 200.

Figure 6:
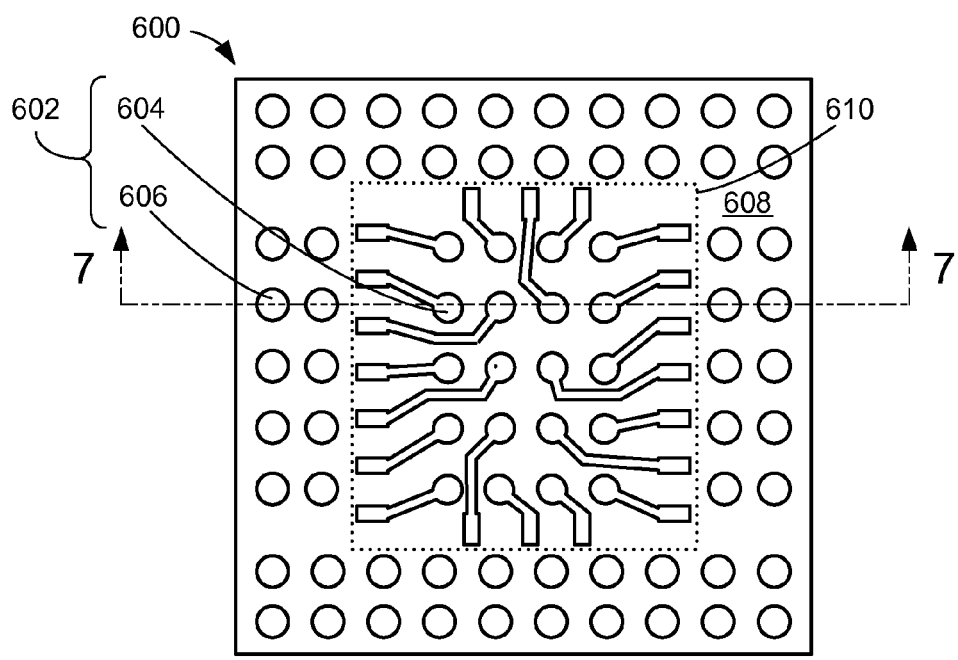
FIG. 6 is a bottom view of a package-on-package system in an alternate embodiment of the present invention.

Referring now to FIG. 6, therein is shown a bottom view of a package-on-package system 600 in an alternate embodiment of the present invention. The package-on-package system 600 includes two types of external connections 602: substrate connections 604 and through vias 606. The substrate connections 604 provide an electrical path between external elements (not shown) and a semiconductor die (not shown) and are contained within an interconnection area 610 of the package-on-package system 600. The through vias 606 extend vertically through a thickness (not shown) of an encapsulant 608, providing electrical connections between the top and bottom surface of the package-on-package system 600. The package-on-package system 600 does not include laminate substrate layers surrounding the substrate connections 604. The substrate connections 604 directly contact the encapsulant 608 and are encapsulated by the encapsulant 608.

Figure 7:
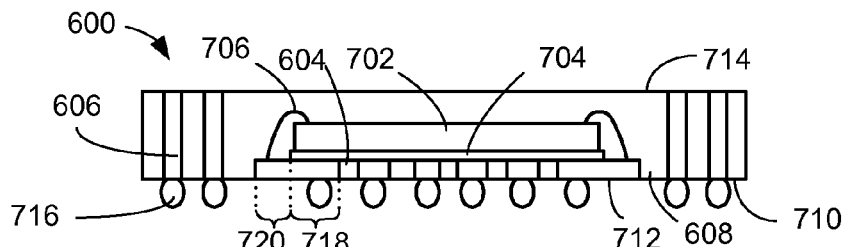
FIG. 7 is a cross-sectional view of the package-on-package system taken along line 7-7 shown in FIG. 6.

Referring now to FIG. 7, therein is shown a cross-sectional view of the package-on-package system 600 taken along line 7-7 shown in FIG. 6. A semiconductor die 702 is attached to the substrate connections 604 using an adhesive 704. Electrical interconnects 706 provide connectivity between the semiconductor die 702 and the substrate connections 604. The electrical interconnects 706 may be implemented using bond wires as shown in FIG. 7. The adhesive 704 directly contacts the substrate connections 604 and encapsulates a segment 718 of each of the substrate connections 604. A remaining segment 720 on each of the substrate connections 604 directly contacts the enacpauslant 608 and is encapsulated by the encapsulant 608.

The encapsulant 608 surrounds at least portions of the semiconductor die 702, the substrate connections 604, the electrical interconnects 706, and the through vias 606. The encapsulant 608 has a bottom exposed surface 710 coplanar with a bottom surface 712 of the substrate connections 604, exposed from the encapsulant 608 and the adhesive 704, and has a top exposed surface 714. The through vias 606 extend from the top exposed surface 714 to the bottom exposed surface 710 of the encapsulant 608. The through vias 606 can also be coplanar to the bottom exposed surface 710 and also coplanar with the top exposed surface 714.

The package-on-package system 600 includes a substrate-less package body 722 formed and defined by the encapsulant 608 and the components encapsulated therein. The through vias 606 may be employed extending through the substrate-less package body 722 to provide interconnectivity between external components mounted above and below the package-on-package system 600. External interconnects 716 provide connectivity to the next system level.

It has been discovered that the package-on-package system 600 can be implemented using the substrate connections 604 with a layout footprint minimally larger than the semiconductor die 702, reducing the overall cost of the package-on-package system 600. Additionally the package-on-package system 600 is less susceptible to warping as a result of the fabrication process.

Thus, it has been discovered that the package-on-package system 600 of the present invention furnishes important and heretofore unknown and unavailable solutions, capabilities, and functional aspects for implementing a low-cost modular package that can be stacked into a multi-level package.

Figure 8:
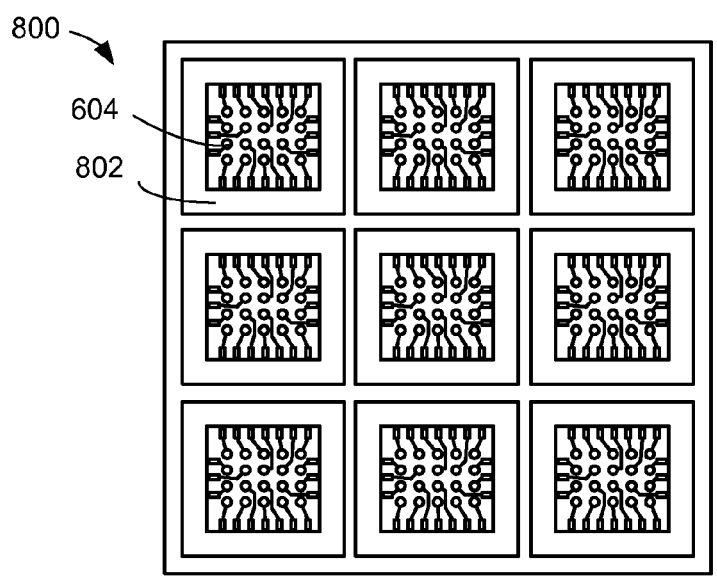
FIG. 8 is a top view of a package substrate assembly incorporating the substrate connections shown in FIG. 6.

Referring now to FIG. 8, therein is shown a top view of a package substrate assembly 800 incorporating the substrate connections 604 shown in FIG. 6. The package substrate assembly 800 incorporates multiple repetitions of the layout for the substrate connections 604 used in each package-on-package system 600. The substrate connections 604 are supported by a package carrier 802. In this embodiment of the invention, the package carrier 802 is a sacrificial plate such as a copper plate. The package carrier 802 is removed after molding the encapsulant 608, leaving only the substrate connection 604 without any substrate or laminate substrate layers in the package-on-package system 600.

Figure 9:
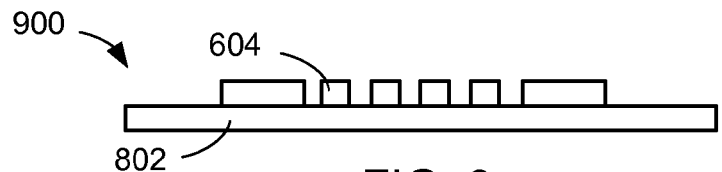
FIG. 9 is a cross-section of a package substrate in the package substrate assembly 800 shown in FIG. 8.

Referring now to FIG. 9, therein is shown a cross-section of a package substrate 900 in the package substrate assembly 800 shown in FIG. 8. At the initial stages of the fabrication process of the package-on-package system 600, each package substrate 900 includes the package carrier 802 and the substrate connections 604. In one embodiment of the invention, the package carrier 802 is a copper plate, and the substrate connections 604 are plated metal traces.

Figure 10:
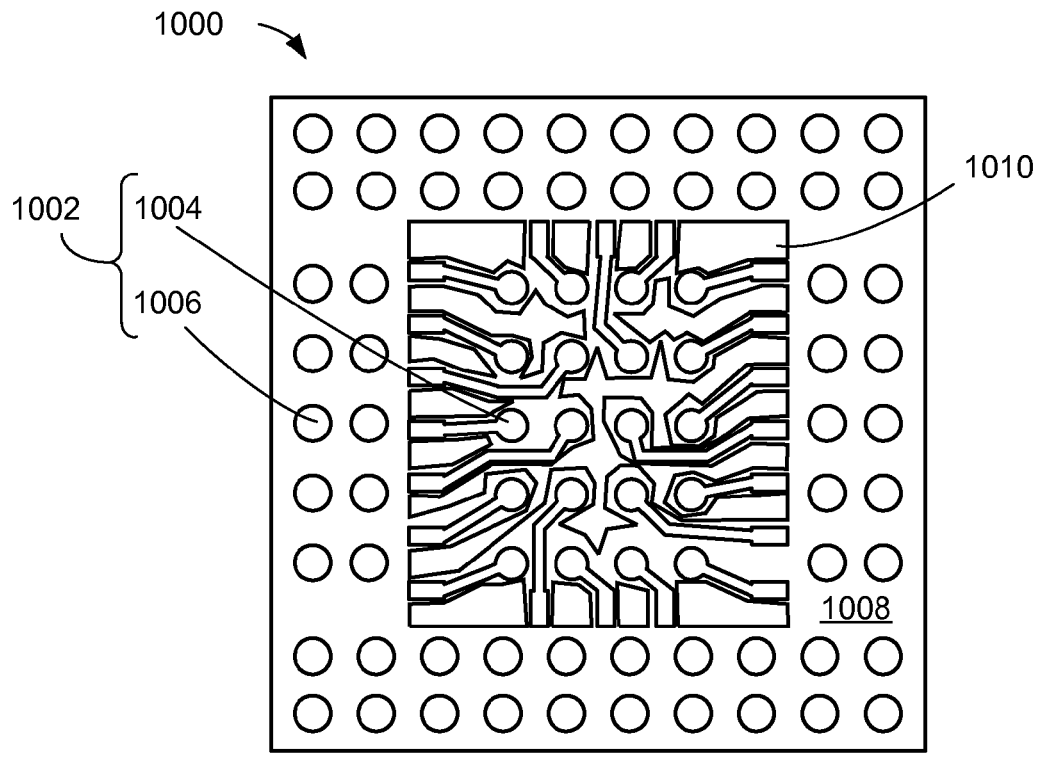
FIG. 10 is a bottom view of a package-on-package system in an alternate embodiment of the present invention.

Referring now to FIG. 10, therein is shown a bottom view of a package-on-package system 1000 in an alternate embodiment of the present invention. The package-on-package system 1000 includes two types of external connections 1002 accessible through its bottom surface: substrate connections 1004 and through vias 1006. The substrate connections 1004 provide an electrical path between external elements and a semiconductor die (not shown). The through vias 1006 extend entirely through the encapsulant 1008, providing electrical connections between the top and bottom surface of the package-on-package system 1000.

The embodiment of the invention shown in FIG. 10 includes dummy patterns 1010 incorporated with the substrate connections 1004 and that are made using the same materials as the substrate connections 1004. The dummy patterns 1010 are features that are used during the fabrication process to facilitate the planarization process for the substrate connections 1004 and to reduce warping of the package-on-package system 1000.

Figure 11:
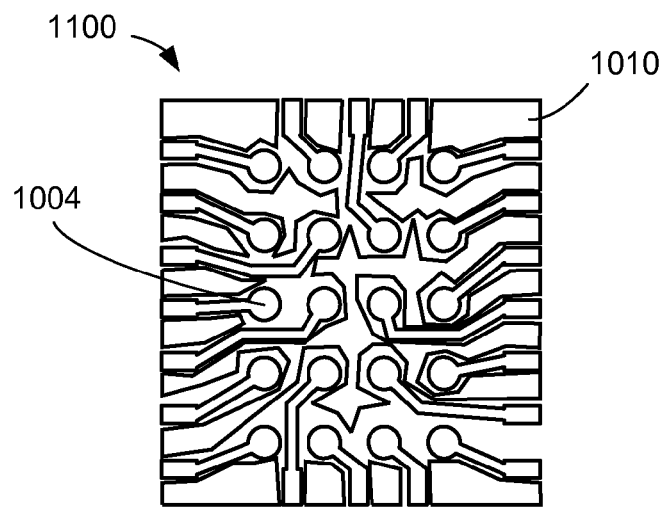
FIG. 11 is a top view of a package substrate incorporating the substrate connections and the dummy patterns used in the package-on-package system shown in FIG. 10.

Referring now to FIG. 11, therein is shown a top view of a package substrate 1100 incorporating the substrate connections 1004 and the dummy patterns 1010 used in the package-on-package system 1000 shown in FIG. 10. The package carrier in the package substrate 1100 is not shown for clarity.

Figure 12:
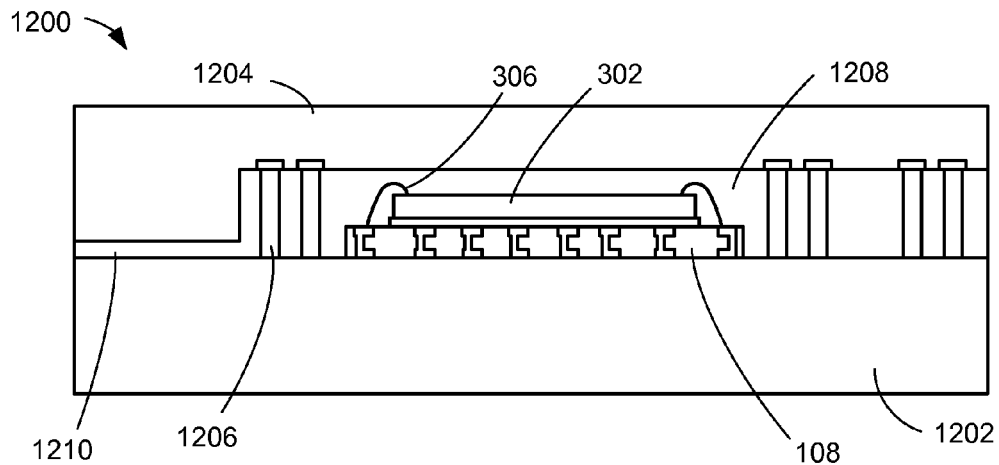
FIG. 12 is a cross section of a mold used in the initial stages of the fabrication of the package-on-package system.

Referring now to FIG. 12, therein is shown a cross section of a mold 1200 used in the initial stages of the fabrication of the package-on-package system 100. At this stage of the process, the semiconductor die 302 is already attached to the package substrate 108 and connected to it using the electrical interconnects 306. The package substrate 108 rests on top of a bottom mold plate 1202. A top mold plate 1204 covers the package substrate 108, the semiconductor die 302, and the electrical interconnects 306.

The openings for the through vias 106 are defined by pins 1206 extending through a molding cavity 1208 defined by the top mold plate 1204 and the bottom mold plate 1202. The encapsulant (not shown) is injected through an injection port 1210 into the cavity 1208.

Figure 13:
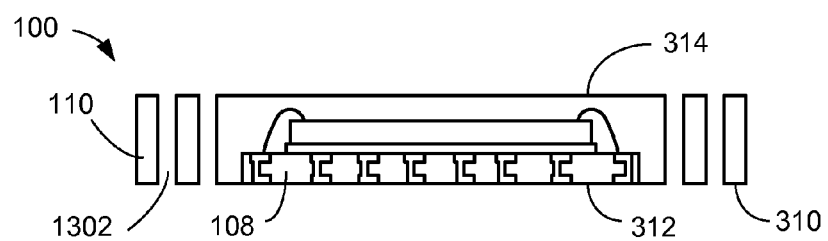
FIG. 13 is a cross-section of the package-on-package system of FIG. 3 following molding of the encapsulant.

Referring now to FIG. 13, therein is shown a cross-section of the package-on-package system 100 of FIG. 3 following molding of the encapsulant 110. The pins 1206 shown in FIG. 12 define through openings 1302 extending through the encapsulant 110. The through openings 1302 are molds for the through vias 106 (not shown).

The encapsulant 110 has the bottom exposed surface 310 coplanar with the bottom surface 312 of the package substrate 108 and has the top exposed surface 314. The through openings 1302 extend from the top exposed surface 314 to the bottom exposed surface 310 of the encapsulant 110.

Figure 14:
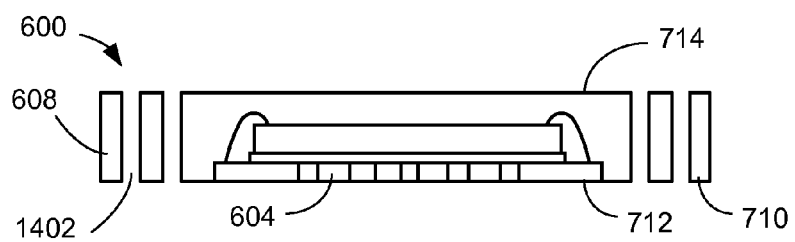
FIG. 14 is a cross-section of the package-on-package system of FIG. 7 following molding of the encapsulant.

Referring now to FIG. 14, therein is shown a cross-section of the package-on-package system 600 of FIG. 7 following molding of the encapsulant 608. The pins 1206 shown in FIG. 12 define through openings 1402 extending through the encapsulant 608. The through openings 1402 are molds for the through vias 606 (not shown). The package carrier 802 of FIG. 8 is dissolved following the formation of the encapsulant 608.

The encapsulant 608 has the bottom exposed surface 710 coplanar with the bottom surface 712 of the substrate connections 604 and has a top exposed surface 714. The through openings 1402 extend from the top exposed surface 714 to the bottom exposed surface 710 of the encapsulant 608.

Referring now to FIG. 15, therein is shown a mechanical device 1500 used to form the through vias 106 in one embodiment of the invention. In this step of the fabrication process for the package-on-package system 100, the structure of FIG. 13 is placed between a support plate 1502 and a stencil plate 1504 of the mechanical device 1500. The through openings 1302, previously defined by the molding of the encapsulant 110, are aligned to openings 1506 in the stencil plate 1504.

The through vias 106 are formed by applying solder 1508 into the through openings 1302 using a wedge 1510. Vertical pressure on the wedge 1510 ensures filling of the through openings 1302. A non-stick material 1512 on the support plate 1502 prevents sticking of the through vias 106.

Referring now to FIG. 16, therein is shown the package-on-package system 100 of FIG. 3 at the end of the fabrication process following the formation of the through vias 106 and the external interconnects 316.

Referring now to FIG. 17, therein is shown the package-on-package system 600 of FIG. 6 at the end of the fabrication process following the formation of the through vias 606 and the external interconnects 716.

Figure 18:
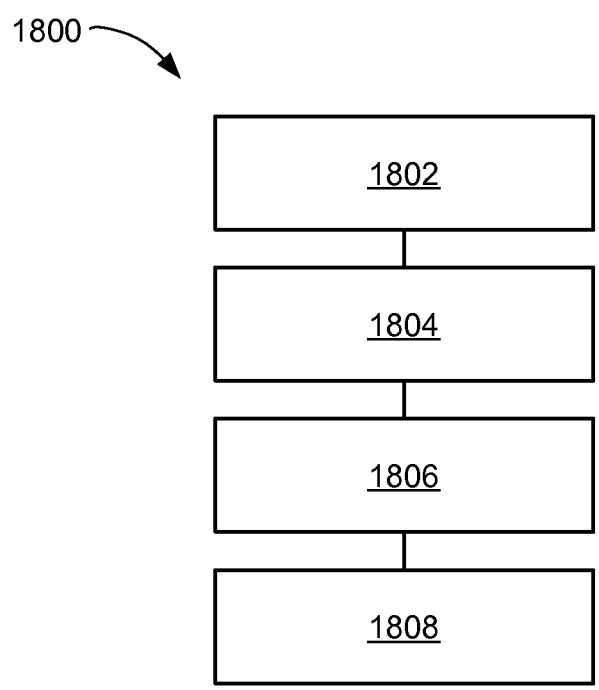
FIG. 18 is a flow chart of a method of manufacture of a package-on-package system in a further embodiment of the present invention.

Referring now to FIG. 18, therein is shown a flow chart of a method 1800 of manufacture of a package-on-package system 100 in a further embodiment of the present invention. The method 1800 includes: providing a substrate connection in a block 1802; attaching a semiconductor die to the substrate connection using an adhesive, with the substrate connection affixed directly by the adhesive in a block 1804; forming an encapsulant around the semiconductor die to have a bottom exposed surface coplanar with a bottom surface of the substrate connection and to have a top exposed surface with through openings extending therefrom through the bottom exposed surface in a block 1806; and, creating through vias by applying solder into the through openings in a block 1808.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of a package-on-package system comprising:
    providing a substrate connection;
    attaching a semiconductor die to the substrate connection using an adhesive, with the substrate connection affixed directly by the adhesive;
    forming an encapsulant around the semiconductor die to have a bottom exposed surface coplanar with a bottom surface of the substrate connection and to have a top exposed surface with through openings extending therefrom through the bottom exposed surface;
    creating through vias by applying solder into the through openings, the through vias coplanar with the bottom exposed surface of the encapsulant and coplanar with the top exposed surface of the encapsulant, and wherein providing the substrate connection includes supporting the substrate connection with a package carrier having the substrate connection there through.

2. The method as claimed in claim 1 wherein forming the encapsulant includes creating through openings located on one side of the substrate connection.

3. The method as claimed in claim 1 wherein attaching the semiconductor die includes encapsulating a segment of the substrate connection with the adhesive and having the bottom surface of the substrate connection exposed from the adhesive.

4. The method as claimed in claim 1 wherein providing the substrate connection includes providing dummy patterns incorporated with the substrate connection.

5. A method of manufacture of a package-on-package system comprising:
    providing a package substrate including a package carrier and a substrate connection;
    attaching a semiconductor die to the package substrate with an adhesive, with the adhesive directly contacting the substrate connection;
    connecting the semiconductor die to the substrate connection in the package substrate using electrical interconnects;
    molding an encapsulant around the semiconductor die using a mold with pins to have a bottom exposed surface coplanar with a bottom surface of the substrate connection and to have a top exposed surface, wherein the pins define through openings extending from the top exposed surface through the bottom exposed surface;
    removing the package carrier of the package substrate; and
    creating through vias by applying solder through a stencil plate with openings aligned to the through openings, the through vias coplanar with the bottom exposed surface of the encapsulant and coplanar with the top exposed surface of the encapsulant.

6. The method as claimed in claim 5 wherein molding the encapsulant including creating through openings located on either side of the substrate connection.

7. The method as claimed in claim 5 wherein:
    attaching the semiconductor die includes encapsulating a segment of the substrate connection with the adhesive and having the bottom surface of the substrate connection exposed from the adhesive; and
    forming the encapsulant includes encapsulating a remaining segment of the substrate connection with the encapsulant directly contacting the remaining segment of the substrate connection and the bottom surface of the substrate connection exposed from the encapsulant.

8. The method as claimed in claim 5 wherein providing the package substrate includes incorporating dummy patterns with the package carrier.

9. The method as claimed in claim 5 wherein molding the encapsulant includes formed a substrate-less package body.

* * * * *